United States Patent
Pond

(10) Patent No.: US 7,173,411 B1
(45) Date of Patent: Feb. 6, 2007

(54) INDUCTIVE PROXIMITY SENSOR USING COIL TIME CONSTANT FOR TEMPERATURE COMPENSATION

(75) Inventor: Robert J Pond, Doylestown, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 309 days.

(21) Appl. No.: 10/955,070

(22) Filed: Sep. 30, 2004

(51) Int. Cl.
*G01B 7/00* (2006.01)
*G01R 33/025* (2006.01)

(52) U.S. Cl. .......................... 324/207.12; 324/207.26; 324/225; 324/207.15

(58) Field of Classification Search ..............
324/207.12–207.26, 225; 331/65, 117 R, 331/167
See application file for complete search history.

(56) References Cited

U.S. PATENT DOCUMENTS

| | | | | |
|---|---|---|---|---|
| 4,378,504 A | * | 3/1983 | Yamasaki | 307/99 |
| 4,543,527 A | * | 9/1985 | Schuchmann et al. | 324/207.26 |
| 5,278,523 A | * | 1/1994 | Kriz | 331/176 |
| 5,508,662 A | * | 4/1996 | Guichard et al. | 331/65 |
| 6,191,580 B1 | * | 2/2001 | Guichard | 324/207.26 |
| 6,529,007 B2 | * | 3/2003 | Ott et al. | 324/327 |

* cited by examiner

*Primary Examiner*—Jay M. Patidar
(74) *Attorney, Agent, or Firm*—Amin Turocy & Calvin LLP; William R. Walbrun

(57) ABSTRACT

Systems and methods are disclosed that facilitate determining coil temperature in a proximity sensor, such as an extended range inductive proximity sensor. Voltage measurements can be taken before, and during, damped oscillatory decay of a voltage in a resonant circuit in the proximity sensor to determine a value, γ, associated with an inductive time constant for the resonant circuit. The gamma value comprises information related to both inductance and resistance in the sensor coil, and can be employed to determine coil temperature. Derivation of the gamma value, and thus of coil temperature, can utilize a current pulse of a duration of approximately one RC time constant of the resonant circuit, thus mitigating current consumption by the proximity sensor during temperature assessment.

28 Claims, 15 Drawing Sheets

INDUCTIVE PROXIMITY SENSOR USING COIL TIME CONSTANT FOR TEMPERATURE COMPENSATION

TECHNICAL FIELD

The present invention relates generally to industrial control systems, and more particularly to systems and methodologies that facilitate reduction of current consumption in industrial control devices and temperature compensation, such as proximity sensors.

BACKGROUND OF THE INVENTION

Industrial control systems have enabled modern factories to become partially or completely automated in many circumstances. These systems generally include a plurality of Input and Output (I/O) modules that interface at a device level to switches, contactors, relays and solenoids along with analog control to provide more complex functions such as Proportional, Integral and Derivative (PID) control. Communications have also been integrated within the systems, whereby many industrial controllers can communicate via network technologies such as Ethernet, Control Net, Device Net or other network protocols and also communicate to higher level computing systems. Generally, industrial controllers utilize the aforementioned technologies along with other technology to control, cooperate and communicate across multiple and diverse applications.

Conventional control systems employ a large array of varied technologies and/or devices to achieve automation of an industrial environment, such as a factory floor or a fabrication shop. Systems employed in an automated environment can utilize a plurality of sensors and feedback loops to direct a product through, for example, an automated assembly line. Such sensors can include temperature sensors (e.g., for determining a temperature of a steel bar that is entering a roller device to press the bar into a sheet . . . ), pressure sensors (e.g., for determining when a purge valve should be opened, for monitoring pressure in a hydraulic line . . . ), proximity sensors (e.g., for determining when an article of manufacture is present at a specific device and/or point of manufacture . . . ), etc.

Proximity sensors are available in a wide variety of configurations to meet a particular user's specific sensing needs. For example, sensors can be end-mounted in a housing, side-mounted in a housing, etc., to facilitate mounting in confined spaces while permitting the sensor to be directed toward a sensing region as deemed necessary by a designer. Additionally, proximity sensors are available with varied sensing ranges, and can be shielded or unshielded. Shielded inductive proximity sensors can be mounted flush with a surface and do not interfere with other inductive proximity sensors, but have diminished sensing range when compared with unshielded proximity sensors.

Of paramount importance in the field of proximity sensors is sensing distance, and, more specifically, increasing sensing distance. A problem often encountered when attempting to extend a sensing range of a proximity sensor is temperature drift, which can cause an error since the resistance change due to a target cannot be distinguished from a change due to temperature. Therefore, it is important to be able to determine coil temperature accurately. For example, an uncompensated change of 1° C. can create an error of about 0.4% in the measurement of the coil resistance. For an extended range 18 mm diameter unshielded sensors with a sensing range of 20 mm, the change in the effective resistance of the coil due to the presence of a target is about 1%. Thus it is seen that a small change in coil temperature can limit the accuracy of the proximity sensor.

As industrial control systems become more complex and as system demands require finer-tuned sensing devices, so too does proximity sensor efficiency become ever more important. Thus, a need exists in the art for systems and methods that facilitate increasing efficiency of sensing devices and accounting for temperature effects on sensing coils in proximity sensors in an industrial automation environment.

SUMMARY OF THE INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

The subject invention provides for systems and methods that facilitate increased accuracy in proximity sensors via determining a time constant value associated with a damping resonant circuit in a proximity sensor. This determination mitigates temperature drift effects and facilitates accurately ascertaining when a target has been sensed despite temperature deviations in a sensing coil. More specifically, the present invention can ascertain coil temperature via determining a value, $\gamma$, associated with an L/R time constant for a sensing coil, where L is inductance and R is resistance, associated with the resonant circuit. Thus, the invention can account for an effect of temperature on coil inductance to more accurately detect coil temperature.

According to one aspect of the invention, a "gamma" value associated with the L/R decay time constant of a sensing coil resonant circuit can be ascertained to help facilitate a determination of coil temperature. For example, an RC time constant can be assessed for the resonant circuit in order to facilitate determining an appropriate duration for a current pulse through the circuit, which in turn permits a determination of the L/R time constant value. According to this example, a first transistor device can be activated to provide current to the circuit for a period of approximately one RC time constant, which allows the capacitor in the circuit to charge to approximately 62.3% of full charge. It is to be appreciated, however, that other pulse durations are contemplated by the subject invention (e.g., two time constants, three time constants . . . ). The single time constant worth of current provides sufficient charge on the capacitor to permit a ringing oscillation to occur in the resonant circuit upon cessation of the current pulse. In this manner, the subject invention can facilitate a determination of coil temperature, and thus sensing distance variation, more quickly and accurately than conventional systems, which typically require many time constants to permit coil resistance to settle to a DC value prior to extrapolation of temperature information. Such conventional circuits are complex and require filters to separate DC and AC energy.

Upon cessation of the current pulse (e.g., deactivation of the first transistor device), a voltage can be measured for the capacitor, and thereafter a second transistor device can be activated. During this period, a charge stored in the capacitor will decay as it rings through an inductor in the resonant circuit. A second voltage measurement can be obtained during an oscillatory decay of the stored charge, which measured value can be divided by the first measured voltage value to determine a value, γ, related to an L/R time constant for the circuit. The gamma damping factor accounts for both resistive and inductive temperature effects on the coil to permit an accurate determination of coil temperature. For example, in an extended range proximity sensor, changes in coil resistance due to the introduction of a target in to a sensing field are typically negligible at extended ranges due to the relatively large distance of the target. Thus, coil resistance is predominantly a function of coil temperature and the natural resistivity of the coil. However, coil inductance is affected by the introduction of a target into the sensing field, even at extended ranges.

To the accomplishment of the foregoing and related ends, certain illustrative aspects of the invention are described herein in connection with the following description and the annexed drawings. These aspects are indicative, however, of but a few of the various ways in which the principles of the invention can be employed and the present invention is intended to include all such aspects and their equivalents. Other advantages and novel features of the invention will become apparent from the following detailed description of the invention when considered in conjunction with the drawings.

DETAILED DESCRIPTION OF THE INVENTION

Figure 1:
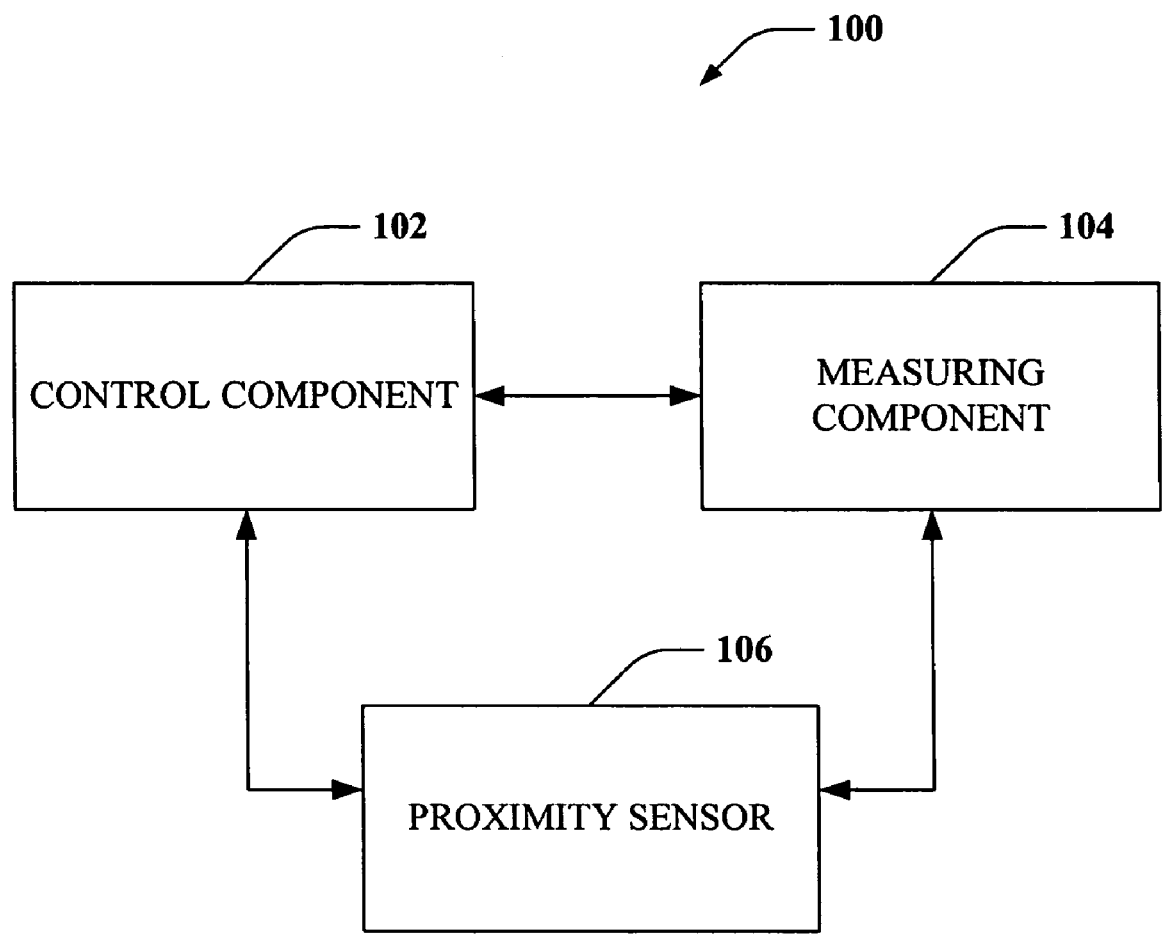
FIG. 1 is an illustration of a system 100 that facilitates temperature compensation of a proximity sensor via measuring a time constant of a sensor coil to determine coil temperature in accordance with an aspect of the subject invention.

The present invention will now be described with reference to the drawings, wherein like reference numerals are used to refer to like elements throughout. The present invention will be described with reference to systems and methods for determining coil temperature in a proximity sensor via measuring a time constant of the coil. It should be understood that the description of these exemplary aspects are merely illustrative and that they should not be taken in a limiting sense.

The term "component" can refer to a computer-related entity, either hardware, a combination of hardware and software, software, or software in execution. For example, a component can be a process running on a processor, a processor, an object, an executable, a thread of execution, a program and a computer. By way of illustration, both an application running on a server and the server can be components. A component can reside in one physical location (e.g., in one computer) and/or can be distributed between two or more cooperating locations (e.g., parallel processing computer, computer network).

It is to be appreciated that various aspects of the present invention can employ technologies associated with facilitating unconstrained optimization and/or minimization of error costs. Thus, non-linear training systems/methodologies (e.g., back propagation, Bayesian, fuzzy sets, non-linear regression, or other neural networking paradigms including mixture of experts, cerebella model arithmetic computer (CMACS), radial basis functions, directed search networks, custom integrated circuits and function link networks) can be employed.

FIG. 1 is an illustration of a system 100 that facilitates determining an accurate trip point in a proximity sensor via measuring a time constant of a sensor coil to determine coil temperature in accordance with an aspect of the subject invention. Typically, resistance in a resonant damping circuit of an extended range proximity sensor is dictated largely by temperature and the temperature coefficient of the coil material (e.g., copper, . . . ), as a target introduced into the sensing field of the sensor is distant enough to permit the target's effect on resistance to be disregarded. However, a distant target has a sizeable effect on inductance in a sensing coil, compared to its temperature.

Given the importance of temperature with respect to coil sensing capabilities, many attempts at compensation have been introduced, including: adding a temperature sensing or compensating element, which often does not track the coil temperature due to temperature gradients within the sensor, and tolerances associated with the compensating element also introduce errors; special coil and/or oscillator construction or multiple coil assemblies, which add cost since they are more complex than a simple two-terminal sensing coil and require special handling of the tiny Litz wire coil windings; adding a reference coil and/or oscillator, which often is not at the same temperature as the sensing coil due to temperature gradients and increased circuit complexity; non-resonant circuit L/R time constant methods, which require more current since the circuit is not resonant and the transient L/R value may be representative of the value at the sensor operating frequency; DC coil resistance measurement, which requires a highly complex circuit and high power to attain usable signal levels since the coil resistance is often low; etc. The subject invention provides improved temperature compensation and sensor operation over such conventional compensation schemes.

The system 100 comprises a control component 102 that can receive and analyze information from a measuring component 104 to determine a damping factor associated with a time constant (e.g., a quotient derived from the inductance, L, of the sensor coil, and the resistance, R, thereof). The measuring component 104 can monitor a proximity sensor 106, and more specifically, a resonant damping circuit in the proximity sensor 106 to facilitate a determination of coil temperature as a product of a damping factor for a resonant circuit in the sensor 106.

For example, a resonant circuit can comprise resistors, capacitors, inductors, etc., that can be manipulated via selective energization of one or more voltage sources in the circuit. One or more gates or transistors (e.g., MOSFETS, . . . ) can additionally be employed to permit selective manipulation of the circuit in order to facilitate obtaining measurements related to circuit parameters at various times during circuit operation and/or monitoring. According to this example, the control component can charge the capacitor $C_1$ through a resistance $R_1$ for a fixed time interval. This time interval can be determined to be approximately one $R_1C_1$, time constant based upon design parameters. The voltage established on the capacitor $C_1$ is a function of the supply voltage and the $R_1C_1$ time constant. If the time interval and precision resistor $R_1$ are fixed, then any changes in the voltage on the capacitor $C_1$ are due to changes in $C_1$. The charging period is activated by closing a first transistor via the control component 102.

Once the current pulse has been terminated by the control component 102, the measuring component 104 can perform a first voltage measurement $V_1$. The control component 102 can then apply a second voltage source to the resonant circuit via a second transistor in the proximity sensor 106, and, after a predetermined temporal period $\Delta t$, a second voltage measurement $V_2$ can be taken by the measuring component 104. The second voltage measurement can provide information related to the voltage characteristics of an inductor $L_1$ in series with a second resistor $R_2$ in the resonant circuit. A value, $\gamma$, which includes expressions related to temperature effects associated with both resistance and inductance, can be determined via dividing the second measured voltage by the first measured voltage. The quotient, $\gamma$, of the voltages can be represented as:

$$\gamma = e^{-(R_2/2L_1)\Delta t}$$

By determining the gamma value, which is related to the time constant $\tau_{L/R}$ (e.g., where $\tau_{L/R}=L_1/2R_2$) of the resonant circuit, the system 100 can account for inductive as well as resistive aspects of temperature effects on the sensing coil in the proximity sensor 106. Once known, $\gamma$ can be employed to determine coil temperature. The derivation of $\gamma$ and various voltage measurement calculations is described in greater detain infra, with respect to FIG. 7.

The control component 102 can then direct the proximity sensor 106 to obtain a measurement of a distance to a target. Depending on temperature variances from a predetermined reference temperature, $T_0$, the sensor 106 can read an incorrect distance to the target. The sensed distance can be described as a function of temperature wherein:

$$T_s = T_s(s,T) = 2\pi(L_1C_1)^{1/2}$$

where $L_1=L_1(s,T)$, $C_1=C_1(T)$, and $R_2=R_2(s,T)$, and where s is distance, T is temperature, and $T_s$ is the measured period, or the reciprocal of a frequency of the resonant circuit. The natural logarithm of the $\gamma$ value can be taken to yield the expression $\ln\gamma = -R_2\Delta t/2L_1$, which can be utilized to determine the exact temperature of the coil. Solving for the inductance:

$$L_1 = (T_s^2)/(4\pi^2 C_1) = L_S + L_T$$

At this point, since the measured gamma or the natural log of gamma can be used to determine coil temperature, a correction value to the measured inductance found from $T_s$ can be deduced. For example, a lookup can be performed to determine a portion of inductance due to temperature $L_T$, which can be predetermined, known from experimentation, design processes, etc. The difference between $L_1$ and $L_T$ is $L_S$, the portion of inductance in the coil that is due to a target. $L_S$ can then be compared to a reference value to determine whether the sensor has been tripped, etc., such that if the measured $L_S$ is greater than or equal to the reference value, then the sensor has been tripped. Thus, via employing both resistance and inductance in a single value determined from measured oscillatory decay characteristics of a damped resonant circuit in a proximity sensor, the present invention can determine sensor coil temperature in a highly accurate manner.

Additionally and/or alternatively, coil temperature can be determined via manipulating the gamma value as follows:

$$d(\ln\gamma) = -(\Delta t/2L_1)(\partial R_2/\partial T)dT - (\Delta t/2L_1)(\partial R_2/\partial s)ds + (\Delta t/2L_1^2)(\partial L_1/\partial T)dT + (\Delta t/2L_1^2)(\partial L_1/\partial s)ds$$

However, the change in the coil resistance $R_2$ is typically small with respect to s (e.g., toward the sensing limit, or trip point, . . . ) in extended range proximity sensors. Similarly, the change in $L_1$ with respect to s and T is also typically very small compared to the change in resistance with temperature. Thus, the last three terms in the above expression are generally of such small values as to be negligible, and the expression can be simplified to:

$$d(\ln\gamma) = -(\Delta t/2L_1)(\partial R_2/\partial T)dT$$

where solving for dT yields:

$$dT = \frac{2L_1}{\Delta t \cdot \frac{\partial R_2}{\partial T}} d(\ln\gamma)$$

Thus, dT, the change in temperature (e.g., from factory calibrated reference temperature value) can be determined from the natural log of the $\gamma$ value. Resistance and inductance variations with respect to temperature can be predetermined and/or known from experimentation, design processes, etc.

It is to be appreciated that taking the natural log of the gamma value facilitates the determination of the change in temperature of the sensor coil, but is not necessarily essential to all aspects of temperature determination, as other manipulations of the gamma value and/or components thereof can be performed in accordance with aspects of the subject invention.

For example, temperature can be measured in the sensor coil via conventional means (e.g., sensors, . . . ) and a lookup can be performed to determine a portion of inductance due to temperature $L_T$, which can be predetermined, known from experimentation, design processes, etc. The difference between $L_1$ (e.g., as derived from the gamma value) and $L_T$ is $L_S$, the portion of inductance in the coil that is due to a target. $L_S$ can then be compared to a reference value to determine whether the sensor has been tripped, etc., such that if the measured $L_S$ is greater than or equal to the reference value, then the sensor has been tripped.

Figure 2:
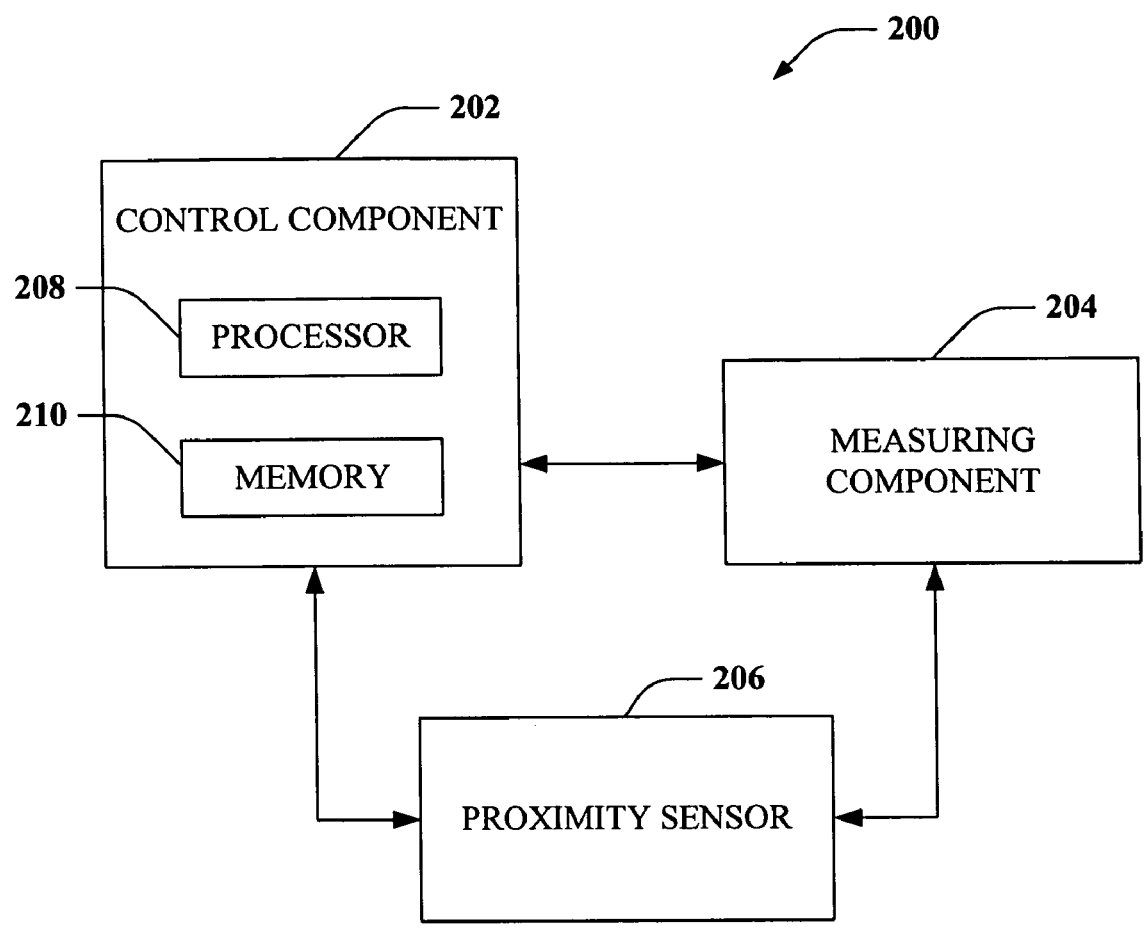
FIG. 2 is an illustration of a system 200 that facilitates a determination of an accurate coil temperature in a proximity sensor by determining a gamma value related to a time constant from which coil temperature information can be extrapolated, in accordance with an aspect of the subject invention.

FIG. 2 is an illustration of a system 200 that facilitates determining the coil temperature of a proximity sensor via determining a gamma value related to a time constant from which coil temperature information can be extrapolated, in accordance with an aspect of the subject invention. The system 200 comprises a control component 202 that is operably coupled to a measuring component 204. The measuring component can monitor a resonant damping circuit in a proximity sensor 206 to glean information related to operating conditions of the proximity sensor 206. For example, information related to inductance, L, and resistance, R, various voltages, etc., of the sensor coil can be measured. Such information can be received by the control component 202 and analyzed by a processor 208 associated with the control component 202. The processor 208 can determine a gamma value related to a time constant, $\tau_{L/R}$, for the sensor coil based on the ratio of the inductance of the coil to the resistance of the coil (e.g., L/R). The control component 202 is further operably coupled to a memory component 210 that can store information related to inductance, resistance, time constant(s), of the coil, and/or any other suitable information related to the operation of the system 200. The control component 202 and/or processor 208 can determine an appropriate duration for directing a pulse of current through the resonant circuit in order to charge a capacitor therein. Upon completion of the current pulse, a voltage measurement can be taken by the measuring component 204 before a second current is applied to the circuit. After a predetermined period, a second voltage measurement can be taken by the measuring component to facilitate determination of gamma value for the circuit, which in turn facilitates accounting for temperature effects on resistance as well as inductance in the sensor 206. It is to be appreciated that the frequency can also be measured during this period.

It is to be understood that the processor 208 can be a processor dedicated to analyzing information associated with the sensor 206, increasing sensing distance and/or reducing sensor current consumption, a processor used to control one or more of the components of the system 200, or, alternatively, a processor that is both used to analyze information, increase sensing distance and/or reduce sensor current consumption, and to control one or more of the components of the system 200. The memory component 210 can be employed to retain information associated with coil temperature, time constant(s), inductance, sensing distance, and/or any other information related to the system 200.

Furthermore, the memory 210 can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The memory 210 of the present systems and methods is intended to comprise, without being limited to, these and any other suitable types of memory.

Figure 3:
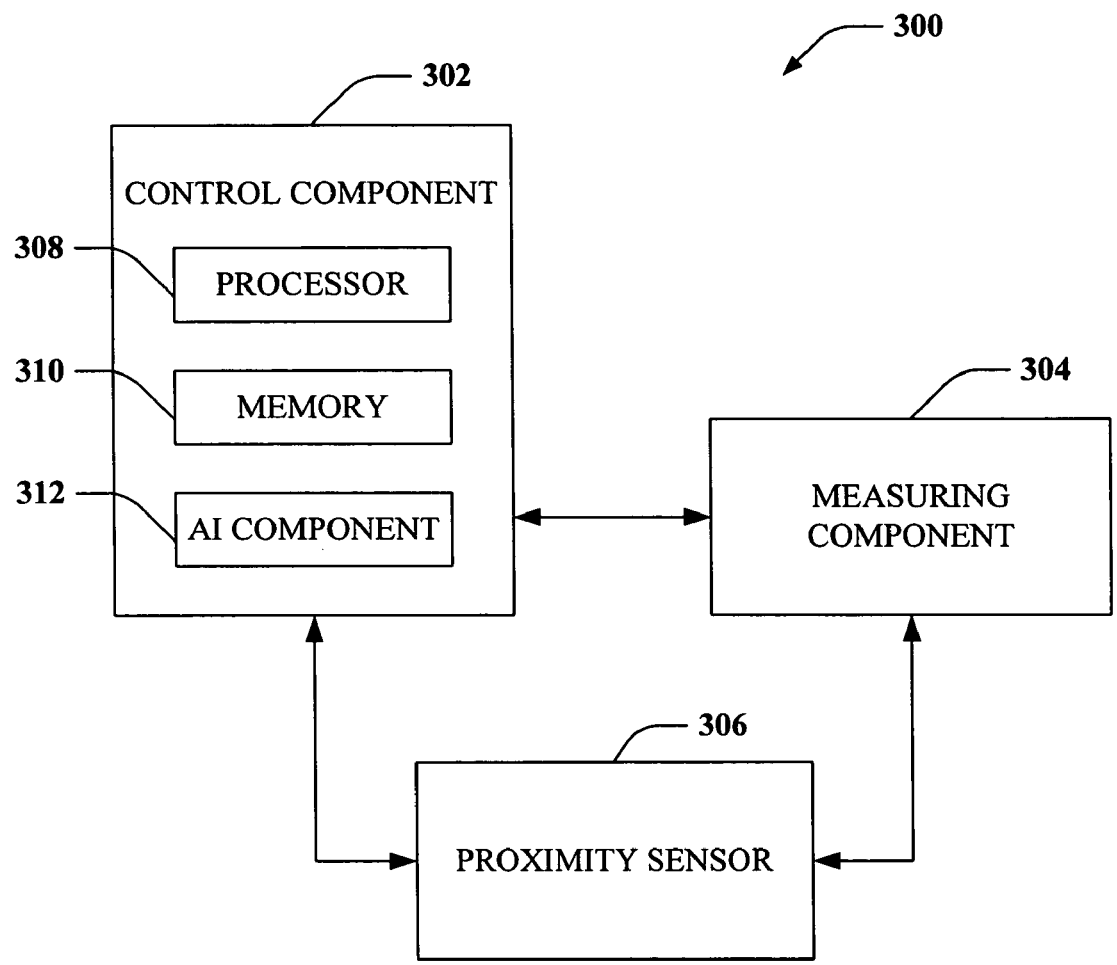
FIG. 3 is an illustration of a system 300 that facilitates a determination of an accurate coil temperature in a proximity sensor in accordance with an aspect of the subject invention.

FIG. 3 is an illustration of a system 300 in accordance with an aspect of the subject invention. The system 300 can employ various inference schemes and/or techniques in connection with reducing current consumption by the proximity sensor, determining a time constant of a coil in the sensor, etc. As used herein, the term "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the subject invention.

Still referring to FIG. 3, a system 300 is illustrated that facilitates performing the measurements required to assess temperature effects on sensing distance in a proximity sensor in accordance with an aspect of the subject invention. The system 300 comprises a control component 302 that controls one or more components of the system 300 and facilitates analysis of information germane to operation of the system 300. The control component 302 is operatively coupled to a measuring component 304 that can measure various aspects of a proximity sensor 306, including but not limited to operating parameters associated with a resonant circuit in the proximity sensor 306. The control component 302 further comprises a processor 308 and a memory 310, as described supra with respect to FIG. 2. Additionally, the control component 302 can comprise an artificial intelligence (AI) component 312 that can make inferences regarding system operation, proximity sensor 306 conditions, etc.

For example, the AI component 312 can infer an appropriate duration of a current pulse through a resonant circuit in the proximity senor 306 in order to facilitate a determination of a time constant for a sensing coil therein, which in turn can permit a highly accurate determination of coil temperature. The coil temperature can then be employed to determine sensing distance as a function of temperature variation on inductance in the sensing coil. Additionally, the particular resonant circuit employed in the proximity sensor 306, in combination with the methods described herein for determining coil temperature, permit such determinations to be made with far less current consumption than conventional systems and/or methodologies.

According to another example, the AI component 312 can make inferences regarding coil temperature in the proximity sensor 306, based at least in part on voltage measurements taken by the measuring component 304 during a test phase. Such inferences can be employed to predict sensing distance variation as a function of the effects of temperature variation on inductance, as well as resistance, in the sensing coil of the proximity sensor 306.

Figure 4:
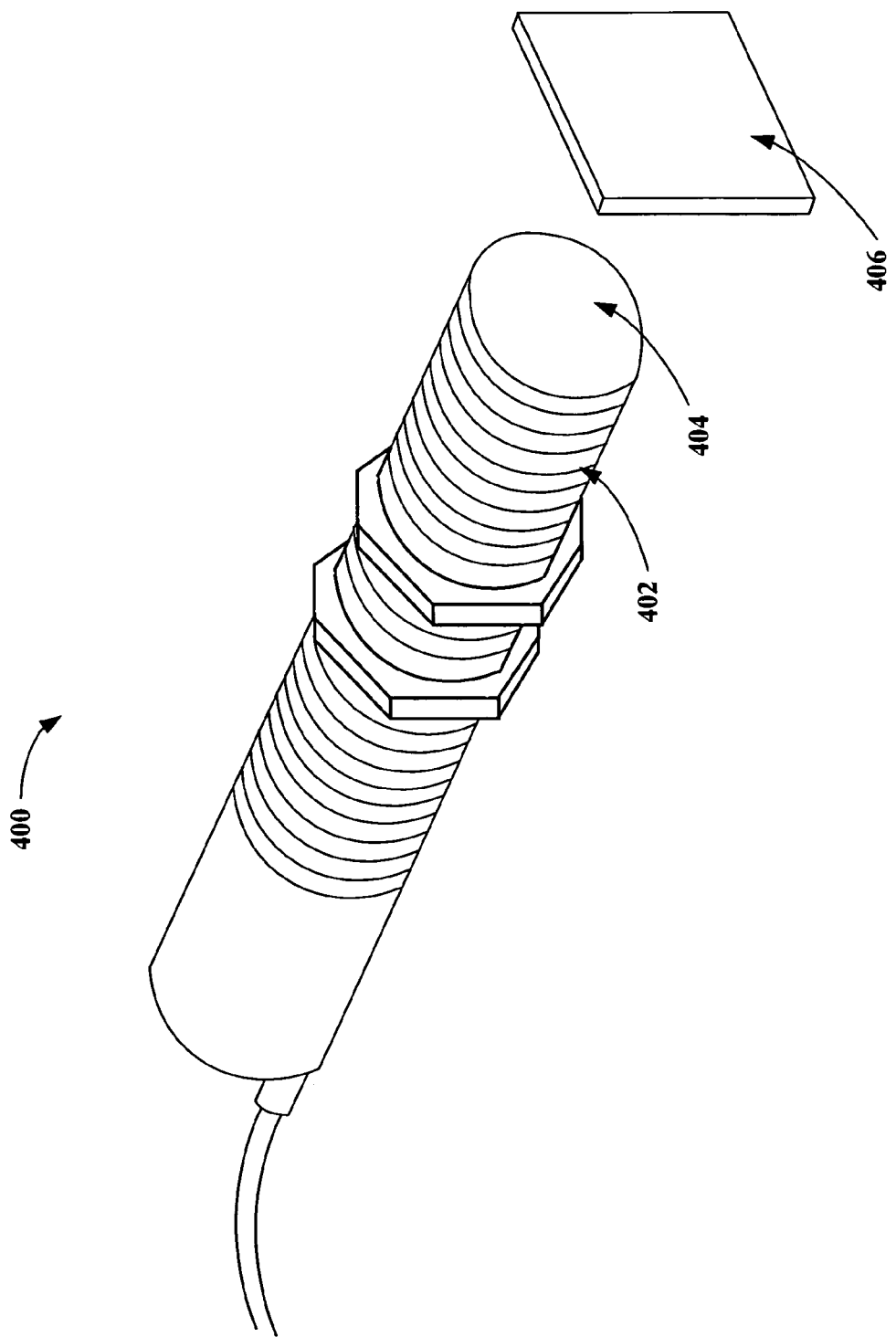
FIG. 4 is an illustration of an inductive proximity sensor 400, which is provided to offer insight into the function of such sensors in accordance with an aspect of the subject invention.

FIG. 4 illustrates an inductive proximity sensor 400, which is provided to offer insight into the function of such sensors. The proximity sensor 400 comprises a proximity switch 402 and a sensor face 404, which can detect a target 406. The sensor face emits an alternating magnetic field when a coil in the sensor is energized (e.g., when an AC current is passed through the coil). When the detectable target 406 enters the field of detection, eddy currents are induced in the target, which dampen the magnetic field emitted from the sensor face. The target 406 can be, for example, a standard detectable object, which is defined as a 1 mm-thick piece of ferrous iron of a length and height equal to the diameter of the sensor face. If a ferrous iron target is assigned a unity detectability value, then other target materials can be rated as to their detectability with respect to ferrous iron to provide a correction factor for determining sensing distance. For instance, a copper target can have a detectability value of 0.4; stainless steel can have a value of 0.8–0.85, etc. The proximity sensor 400 is discussed in greater detail infra, with respect to FIG. 5.

Figure 5:
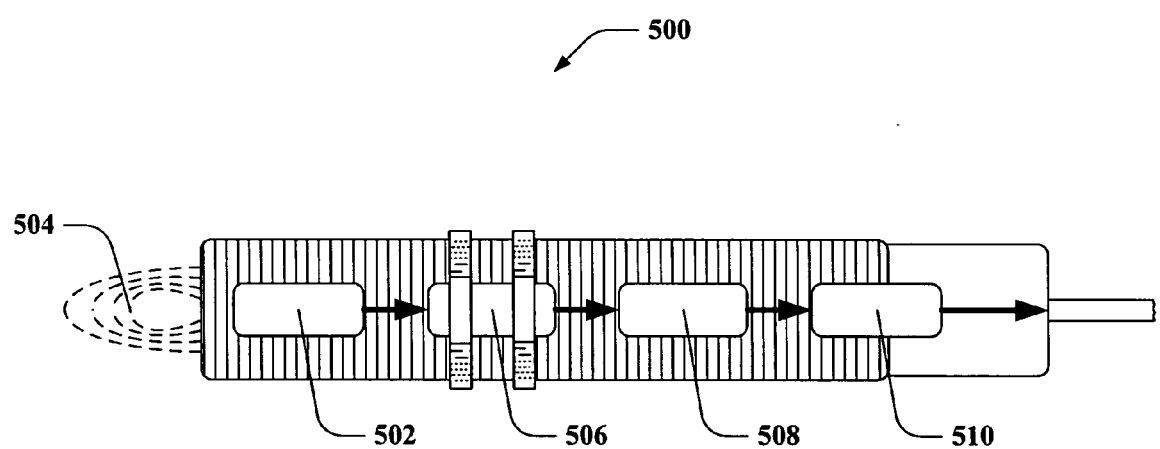
FIG. 5 is an illustration of a typical inductive proximity sensor 500 according to an aspect of the subject invention.

FIG. 5 is an illustration of a typical inductive proximity sensor 500 according to an aspect of the subject invention. The proximity sensor 500 comprises a coil 502. Conventional inductive proximity sensors operate by generating an electromagnetic field and detecting eddy current losses that arise during entry of a ferrous and/or non-ferrous metal target into the electromagnetic field 504. The coil 502 loses energy upon introduction of a target into the electromagnetic field, which in turn causes amplitude to be reduced in an oscillator 506 and the frequency to change. A trigger circuit 508 recognizes such changes in amplitude and/or frequency and generates a signal that can induce a state change in a solid state output 510. Temperature variances can alter the resistance, inductance, etc., of the coil 502. Such temperature variances can result from ambient environmental factors and/or from internal factors, such as heating of the coil during current conduction. When the coil temperature is changed, the effective operating distance is affected, resulting in diminished operational sensing capacity in the proximity sensor.

For example, when an object enters the electromagnetic field 504 of the proximity sensor 500, eddy currents are induced in the object as a result of the influence of the electromagnetic field 504. Losses created thereby can effectively be reflected back to the sensing coil 502 and increase the resistance, decrease the inductance, etc. thereof. By determining a time constant based on the inductance and resistance of particular components in a resonant circuit in the proximity sensor, the subject invention can determine a temperature of the coil 502 and assess its impact on sensing distance using substantially les current than conventional systems and/or methodologies while mitigating the duration of a testing period in which the effects of temperature variance are assess. This in turn improves the duty cycle of proximity sensor with respect to typical assessment methods that require longer testing periods.

Figure 6:
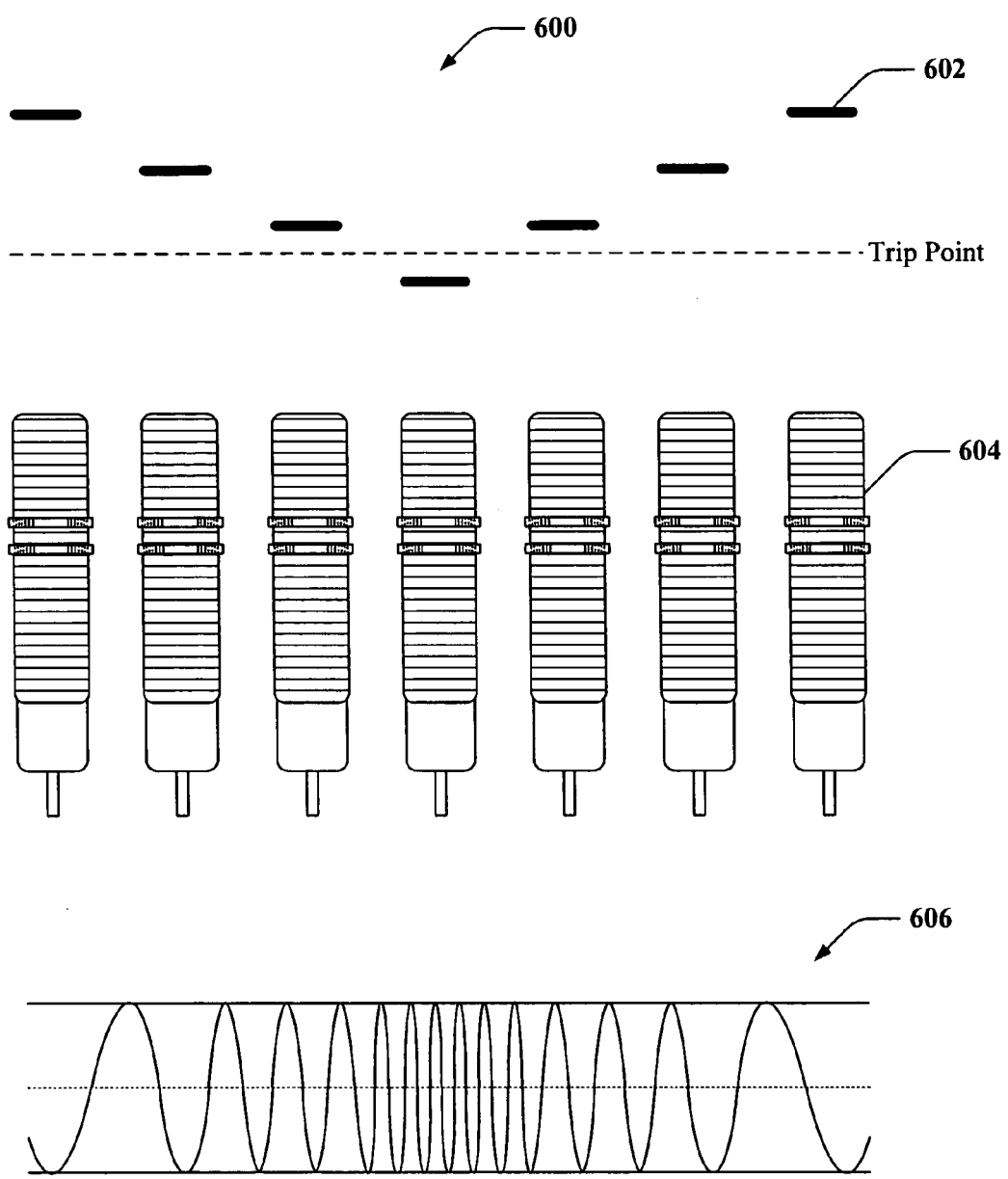
FIG. 6 is an illustration of a system 600 depicting an oscillatory response 606 of an inductive proximity sensor offered to further exemplify typical sensor operation.

FIG. 6 is an illustration of a system 600 depicting an oscillatory response 606 of an inductive proximity sensor offered to further exemplify typical sensor operation. A target 602 is shown at varying distances from a proximity sensor 604. As the target 602 approaches the sensor 604, the target 602 alters the resonant frequency of a resonant circuit in the sensor 604. When the target enters the sensing range of the sensor 604, the frequency increases due to a decrease in inductance. For example, when the target is outside the sensing range, the oscillatory response will facilitate a steady state output of "off." When the target 602 crosses a trip point, at which a sufficient frequency change in the resonant circuit occurs, a steady state output of "on" will occur. It is to be appreciated that the sensing distance trip point depicted in FIG. 6 is illustrative in nature, and that FIG. 6 is not drawn to scale with regard to a relationship between sensing distance, proximity sensor length, target size, etc.

Figure 7:
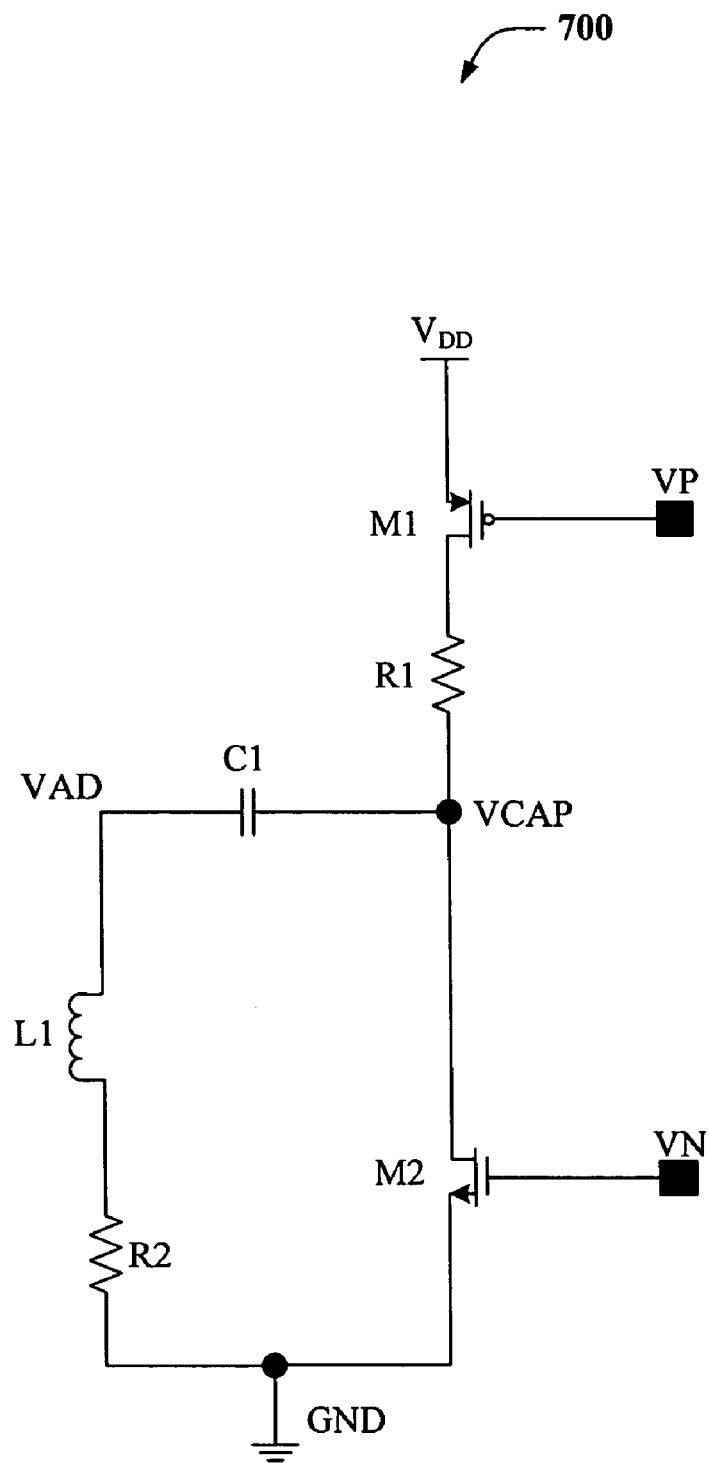
FIG. 7 is an illustration of an exemplary resonant damping circuit 700 that facilitates analysis of temperature effects coil resistance while mitigating current consumption in accordance with an aspect of the subject invention.

FIG. 7 illustrates an exemplary resonant damping circuit 700 that can be monitored and/or manipulated to facilitate analysis of temperature effects on sensing distance while mitigating current consumption in accordance with an aspect of the subject invention. The circuit 700 comprises a first resistor $R_1$ and a capacitor $C_1$ from which a time constant $\tau_{RC}$ can be derived. For example, a first transistor, $M_1$, in the circuit 700 can be in activated to permit $C_1$ to charge via a current pulse that has a duration of approximately one $\tau_{RC}$. For instance, if $R_1$ has a value of 10kΩ and $C_1$ has a value of 14.34ηF, then $\tau_{RC}$ will equal 0.0001434. Thus, current can be pulsed through the circuit for a duration of about 0.0001434 seconds in order to permit $C_1$ to charge to approximately 62.3 percent of capacity. If $R_1$ is a precision resistor, the amount of charge placed on $C_1$ during $\tau_{RC}$ will depend only on $C_1$, assuming the power supply voltage is fixed. Changes in $C_1$ will cause a change in the measured voltage. This will permit the estimation of that portion of the change in the resonant frequency that is due to change in the capacitor, $C_1$.

Additionally, the resonant damping portion of the circuit 700 comprises an inductor $L_1$ and a second resistor $R_2$. Exemplary standard values for $L_1$ and $R_2$ can be, for instance, 324 µH and 2.73Ω (e.g., a typical resistance for copper wire in a sensing coil at a standard reference temperature), respectively, although the components are not limited to such values, but rather can comprise any suitable values to provide functionality to the subject invention. Additionally, it is to be understood that the inductance and resistance values described above can vary as temperature changes, for which variances the subject invention accounts.

During the initial charging pulse, the left side of $C_1$ is essentially grounded because $L_1$ is a low impedance, and thus the charge on $C_1$ is determined by the duration of a voltage applied to $V_P$. The longer a voltage is applied to $V_P$, the higher the charge on $C_1$; therefore, the duration of the voltage application to $V_P$ to provide the current pulse can be limited to a approximately one $\tau_{RC}$ to limit current consumption by the sensor during a test sequence. The capacitor $C_1$ can be charged via application of a voltage described by the following expression:

$$V_1 = V_{dd}\left(1 - e^{\frac{t}{R_1 C_1}}\right) = V_P$$

Upon cessation of the current pulse (e.g., $M_1$ is turned off, or opened) the voltage on $V_{CAP}$ can be measured and the measurement designated as $V_1$ (illustrated in FIG. 8 at $S_1$), wherein:

$$V_1 = V_P e^{-(R_2/2L_1)t_1}\sin(\omega t_1) = V_P \text{ at time } 0.$$

$V_1$ can be measured to determine a peak value therefore, which results in the argument of the sine being equal to 1, thereby simplifying the above equation to:

$$V_1 = V_P e^{-(R2/2L1)t1}$$

Figure 8:
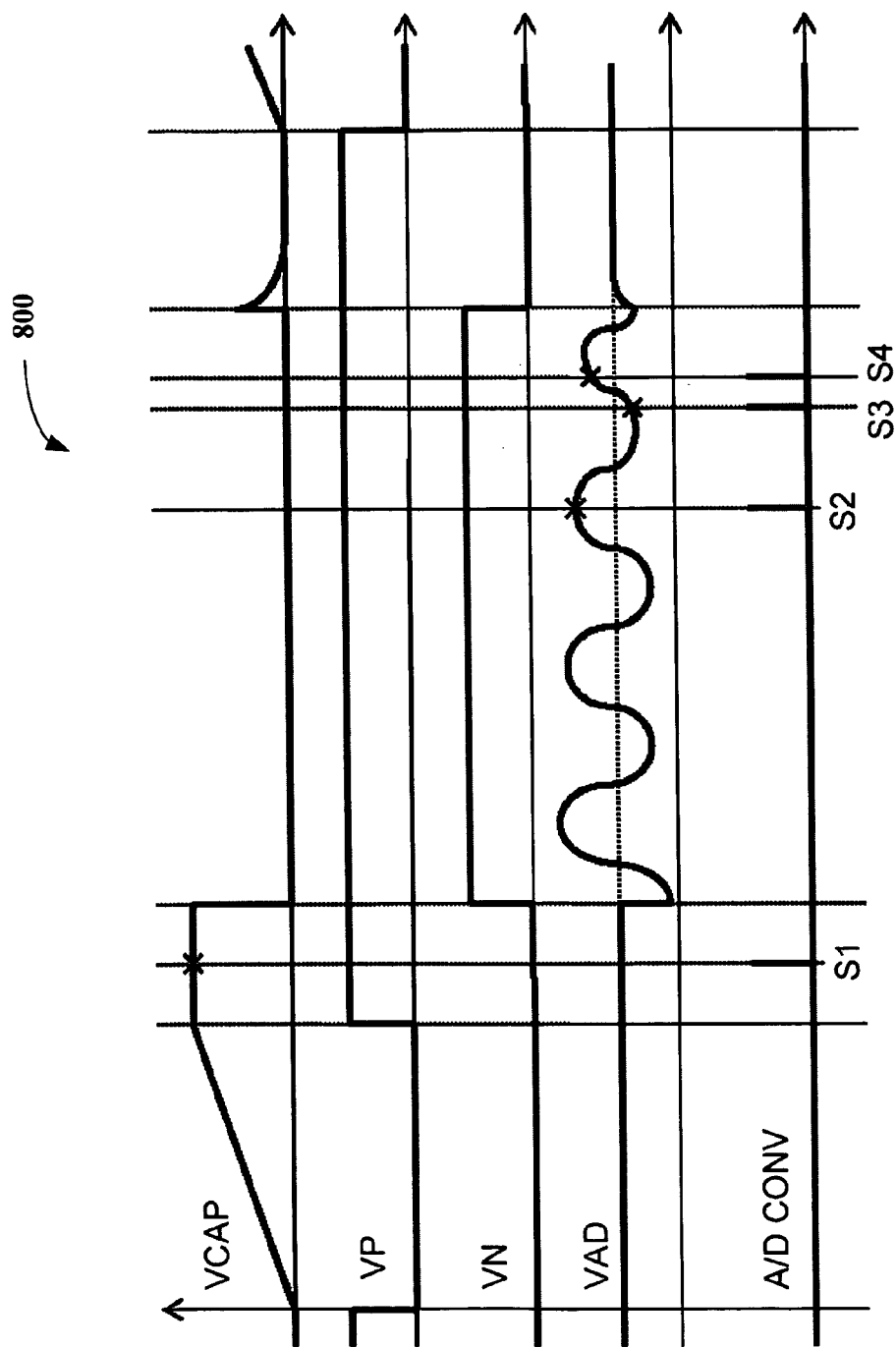
FIG. 8 is an illustration of exemplary voltage characteristics 800 and measurement points thereon as described with respect to FIG. 7 and in accordance with aspects of the subject invention.

After the voltage $V_P$ has been measured, $M_2$ can be closed, forming a damped oscillatory RLC circuit where energy is supplied by the voltage on $C_1$. During the decay the zero crossings of the resonant circuit voltage, $V_{AD}$, can be used to determine the sensor frequency change using techniques that are well known in the art. This can be determined, for example, from measurements at $S_3$ and $S_4$ (FIG. 8). It can be appreciated that immediately after $M_2$ is closed the voltage on the resonant circuit, $V_{AD}$ is equal to $-V_P$ prior to the commencement of ringing.

After a decay time, $t_2$, where $t_2$ is chosen so that $\omega t_2 = \omega t_1 + 2n\pi$, (n is an integer), $V_{AD}$ can be measured to determine a peak value $V_2$ there for, such that:

$$V_2 = V_P e^{-(R2/2L1)t2} \sin(\omega t_2)$$

Again, the measurement can be taken to determine a peak voltage in order to ensure that the sine of the argument $\omega t_2$ is equal to 1, which permits reduction of the expression immediately above to:

$$V_2 = V_P e^{-(R2/2L1)t2}$$

The expressions for $V_1$ and $V_2$ can be manipulated to produce a value, $\gamma$, which is independent of voltage amplitude.

$$\gamma = (V_2/V_1) = e^{-(R2/2L1)\Delta t}$$

where $\Delta t$ represents the change in time between $t_0$ and $t_2$. From the $\gamma$ value, coil temperature can be determined. Resistance is a linear function of temperature, which relationship is based on a temperature coefficient (e.g., the temperature coefficient for copper is approximately 0.004/ C). When employing the subject systems and methodologies to determine coil temperature in an extended range proximity sensor, changes in resistance due to a target are largely negligible because the target is sufficiently distant when detected. Thus, coil resistance in extended range proximity sensors is mainly dependent on the coefficient of resistance for the coil material and the temperature of the coil. However, the target does have an effect on coil inductance which can be determined by measuring the frequency (or period) of the free decay oscillation.

FIG. 8 illustrates an exemplary series of waveforms 800 and measurement points thereon as described with respect to FIG. 7 and in accordance with aspects of the subject invention. The voltage $V_{CAP}$ throughout a test phase described supra is depicted. A plurality of voltage measurements are taken at various points during a test phase. A first peak measurement $S_1$ is taken to determine a peak voltage $V_1$ after a transistor $M_1$ (FIG. 7) has been turned on and off. A second transistor $M_2$ (FIG. 7) can be turned on, and after a predetermined period of damping, a second peak voltage measurement $V_2$ (e.g., as determined from measurement $S_2$) can be taken to determine $V_{AD}$. The two voltage measurements can then be manipulated as described above to derive a $\gamma$ value for the resonant circuit to facilitate temperature determination of a sensor coil. Because $V_{AD}$ is measured at peak voltage points, the sines of the $\omega t$ arguments in the respective measurements are equal to 1, thereby simplifying analysis of the resonant circuit.

Figure 9:
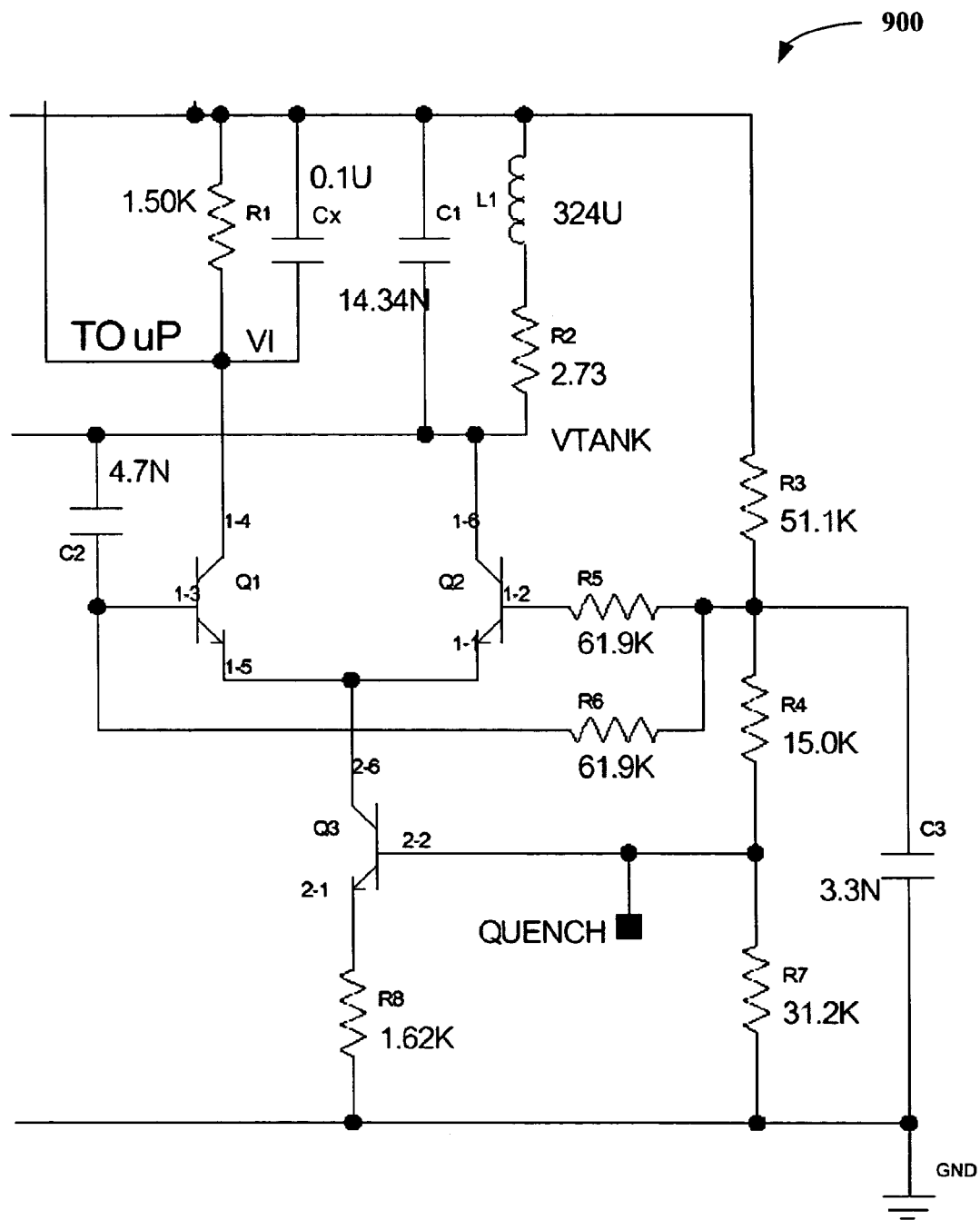
FIG. 9 is an illustration of a circuit 900 (e.g., oscillator, . . . ) that facilitates analysis of temperature effects on sensing distance while mitigating current consumption in accordance with an aspect of the subject invention.
Figure 10:
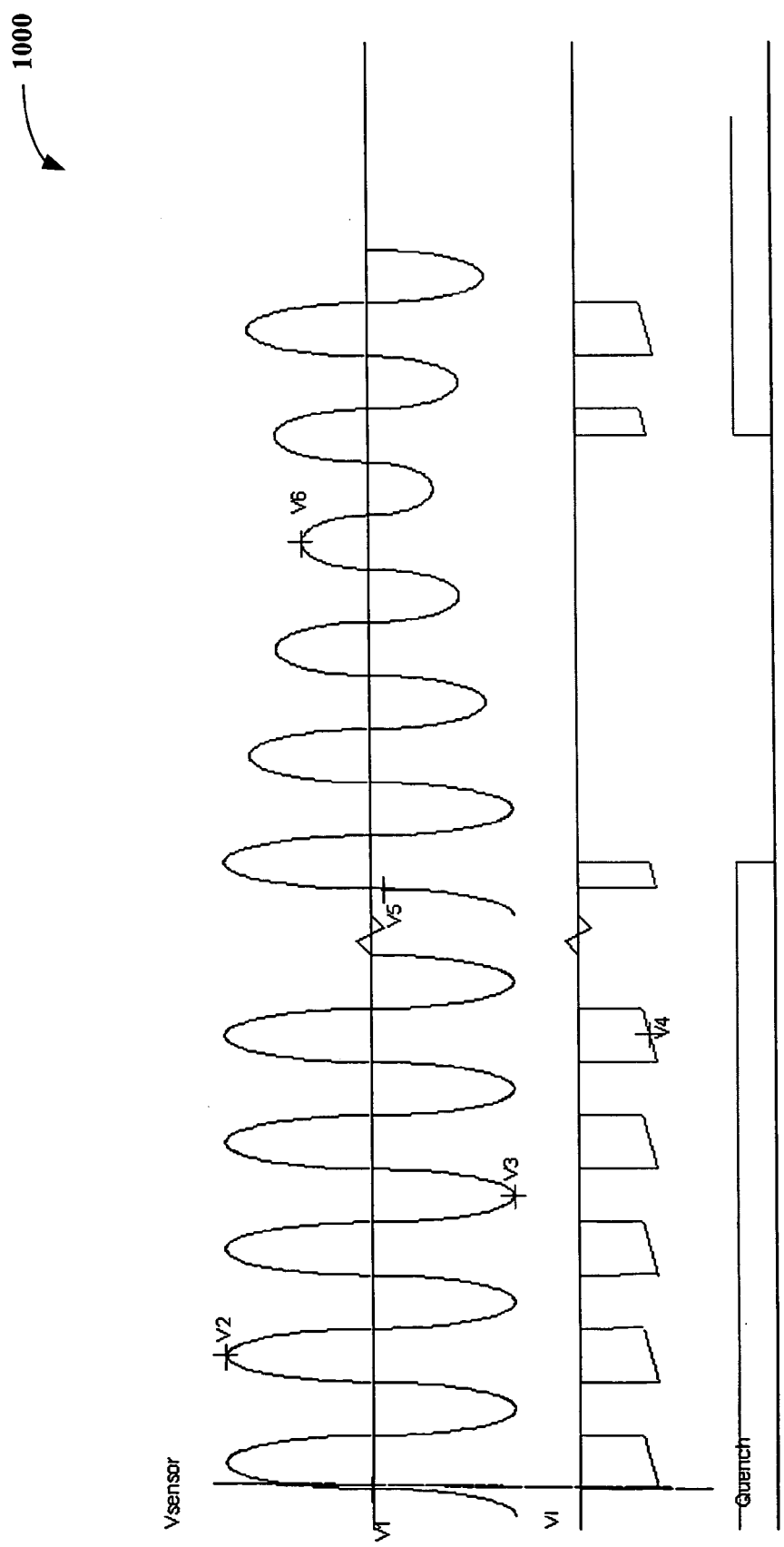
FIG. 10 is an illustration of exemplary oscillatory voltage sine wave 1000 and measurement points thereon as described with respect to FIG. 9 and in accordance with aspects of the subject invention.

Now turning to FIGS. 9 and 10, an exemplary oscillator circuit 900 is illustrated that can be manipulated to mitigate temperature effects on sensing distance while reducing current consumption in accordance with an aspect of the subject invention. It is to be appreciated that the particular values associated with the various elements depicted in FIG. 9 (e.g., resistors, capacitors, inductors, ... ) are exemplary in nature and are not intended to be interpreted in a limiting sense. The circuit 900 is similar to traditional oscillator circuitry, and is presented to illustrate that the subject invention can be employed with such circuitry. Transistors $Q_1$ and $Q_2$ form a differential pair driven by a constant current from $Q_3$. $Q_1$ and $Q_2$ behave in a manner similar to a comparator that diverts the current from $Q_3$ into either $Q_1$ or $Q_2$, depending on the voltage difference between the bases of $Q_1$ and $Q_2$. If the base of $Q_1$ is low, all of $Q_3$'s current will be diverted into the tank circuit, $L_1 C_1 R_2$. If the voltage on the base of $Q_1$ is high, then the current from $Q_3$ will pass into $R_1$. The current in $Q_1$ and $Q_2$ can be a square wave as shown in FIG. 10 as VI. $C_3$, in combination with $R_2$, form a low pass filter that permits measurement of a DC component of the square wave current. Such information can be utilized to ascertain changes in the drive current due to temperature and component tolerances by measuring $V_4$. The square wave as shown has a slight slope (exaggerated in FIG. 10 to show capacitive effects in the differential pair).

The fundamental component of the square wave current excites the narrow band resonant tank circuit so that the tank voltage is sinusoidal as shown in FIG. 10. Positive feedback to sustain oscillation is provided by the coupling capacitor, $C_2$. Resistors $R_5$ and $R_6$ provide biasing current and isolation for the bases of $Q_1$ and $Q_2$ and have a negligible voltage drop across them. The voltage $V_{tank}$ can be viewed as being proportional to the resonant circuit impedance while the voltage VI across $R_1$ monitors changes in the drive current to the resonant circuit.

With reference to FIG. 10, wave forms 1000 are illustrated that describe voltage characteristics of the circuit 900 at various points during operation. It can be seen that a sine wave peak to peak voltage can be determined by measuring $V_2$ and $V_3$. Frequency change can be determined by measuring the change in $V_5$ or by other well known techniques. Finally, a control component (not shown) can cause a voltage pulse on the base of $Q_3$, reducing its current to zero. Since the resonant circuit no longer receives current pulses to sustain oscillation, the resonant circuit begins a period of free decay. This decay can yield a decay constant value, $\gamma$, by measuring $V_6$ and combining/manipulating with $V_2$ to determine the ratio (e.g., as described supra):

$$\gamma = (V_6/V_2) = e^{-(R2/2L1)\Delta t}$$

Figure 11:
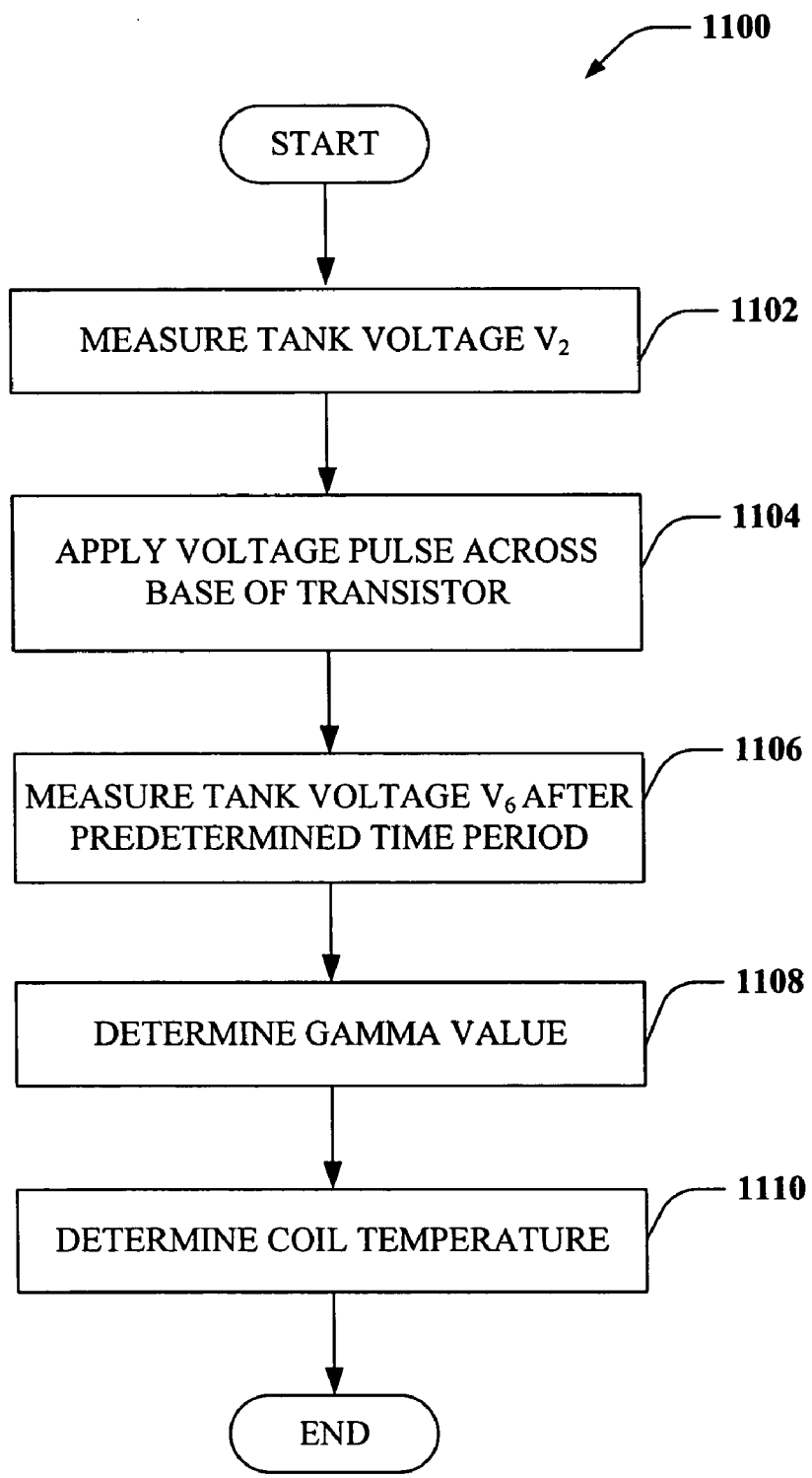
FIG. 11 is an illustration of a methodology 1100 for determining coil temperature for a sensing coil employed in conjunction with an exemplary oscillator circuit.
Figure 12:
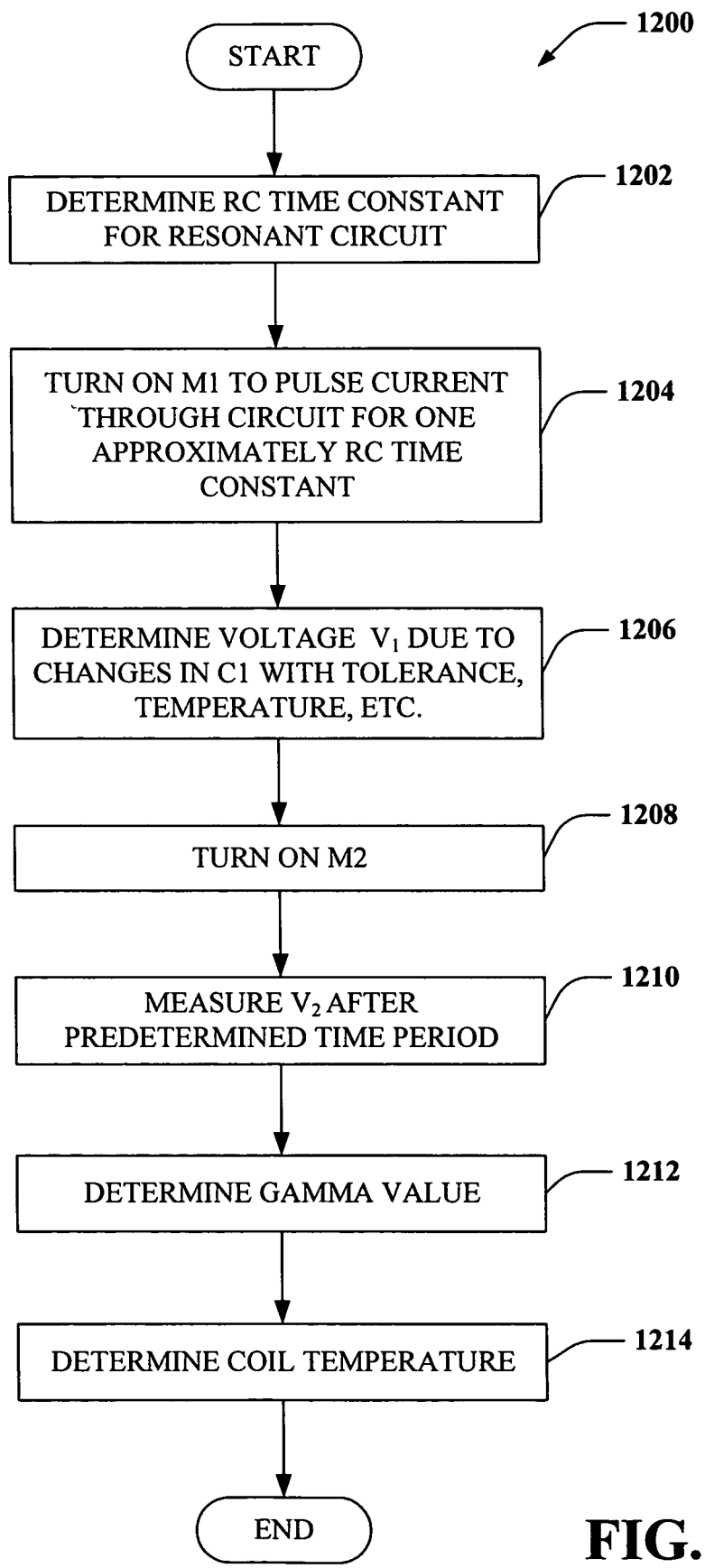
FIG. 12 is an illustration of a methodology 1200 for determining coil temperature using a time constant that accounts for inductive and resistive aspects of a resonant damping circuit in a proximity sensor, in accordance with an aspect of the present invention.

Turning briefly to FIGS. 11 and 12, methodologies that can be implemented in accordance with the present invention are illustrated. While, for purposes of simplicity of explanation, the methodologies are shown and described as a series of blocks, it is to be understood and appreciated that the present invention is not limited by the order of the blocks, as some blocks can, in accordance with the present invention, occur in different orders and/or concurrently with other blocks from that shown and described herein. Moreover, not all illustrated blocks may be required to implement the methodologies in accordance with the present invention.

FIG. 11 is an illustration of a methodology 1100 for determining coil temperature using a time constant value that comprises both inductive and resistive aspects of an oscillator and/or tank circuit associated with an inductive proximity sensor, such as the oscillator described with reference to FIGS. 9 and 10. FIG. 11 is offered to illustrate that the systems and methods described herein are not limited to facilitating determinations of gamma values and/ or temperatures of resonant circuits alone, but rather can be employed in conjunction with any suitable circuitry that is employed to facilitate control of a proximity sensor and detection of a target thereby. At 1102, a measurement can be taken to determine a voltage $V_2$ (e.g., as described with reference to FIG. 10) across the tank circuit. Oscillatory decay of the tank voltage can be induced at 1104 via providing a voltage pulse across the base of a transistor (e.g., $Q_3$, as described with respect to FIG. 9). After a predetermined time period, a second tank voltage measurement $V_6$ can be taken at 1106. A gamma value that comprises both inductive and resistive aspects of the circuit can be derived at 1108 via dividing the voltage $V_6$ by the voltage $V_2$. Finally, at 1110, the gamma value can be employed as described supra to determine coil temperature. Thus, by quenching the oscillator, coil temperature can be determined in a manner that is more efficient and more precise than can be achieved with conventional methods.

FIG. 12 is an illustration of a methodology 1200 for determining coil temperature using a time constant value that accounts for inductive and resistive aspects of an oscillatory resonant damping circuit in a proximity sensor while mitigating current consumption by the proximity sensor, in accordance with an aspect of the subject invention. At 1202 an RC time constant for a resonant damping circuit in a proximity sensor can be determined using known resistance and capacitance values. For example, an RC time constant, $\tau_{RC}$ can be derived wherein $\tau_{RC} = R_1 C_1$, as described supra with respect to FIG. 1. At 1204, a first transistor can be turned on to permit the capacitor in the resonant circuit to charge. The first transistor can be turned on to provide a current pulse for a duration of approximately one RC time constant, thus requiring less time and less current than conventional systems and/or methodologies. At 1206, a peak voltage resonant circuit, $V_{CAP}$ can be measured. Changes in $V_{CAP}$ at this time are due to changes in $C_1$ since the time period, resistance $R_1$, and the power supply are constant. Then, at 1208, a second transistor can be turned on to permit the charge stored in the capacitor to ring through an inductor and a second resistor in the resonant circuit. After a predetermined time period (e.g., determined by a crystal vibration clock, a preset timing device, or any other suitable device . . . ), $V_{AD}$ can be measured at 1210. The second measurement can be timed to occur such that $\omega t_2 = \omega t_1 + 2n\pi$, where $t_2$ and $t_1$ represent the times at which the second and first measurements are taken, and where n is an integer. In this manner, calculations of a gamma value can be simplified in that the sine of any argument containing $\omega t_1$ or $\omega t_2$ will be equal to 1.

At 1212, gamma value associated with an L/R time constant for the sensing coil in the oscillatory resonant damping circuit that is independent of voltage amplitude can be determined via manipulation of the peak voltage measurements. For example, dividing the second measured peak voltage by the first measured voltage provides a value that is independent of voltage amplitudes and representative of the L/R time constant for the circuit, thus accounting for temperature effects associated with inductance in the sensing coil. At 1214, coil temperature can be determined via manipulation of the gamma value, as described herein. This method of temperature compensation automatically includes the L/R ratio, thereby mitigating a need for comparing resonant impedance with a reference resistor. Due to this aspect of the subject invention, current consumption is reduced because the current pulse duration is kept short (e.g., the circuit need not settle to a DC value prior to measurement, which typically requires a minimum pulse duration of 4–5 time constants, . . . ), thereby reducing down time of the sensor during accuracy testing and/or temperature assessment.

Figure 13:
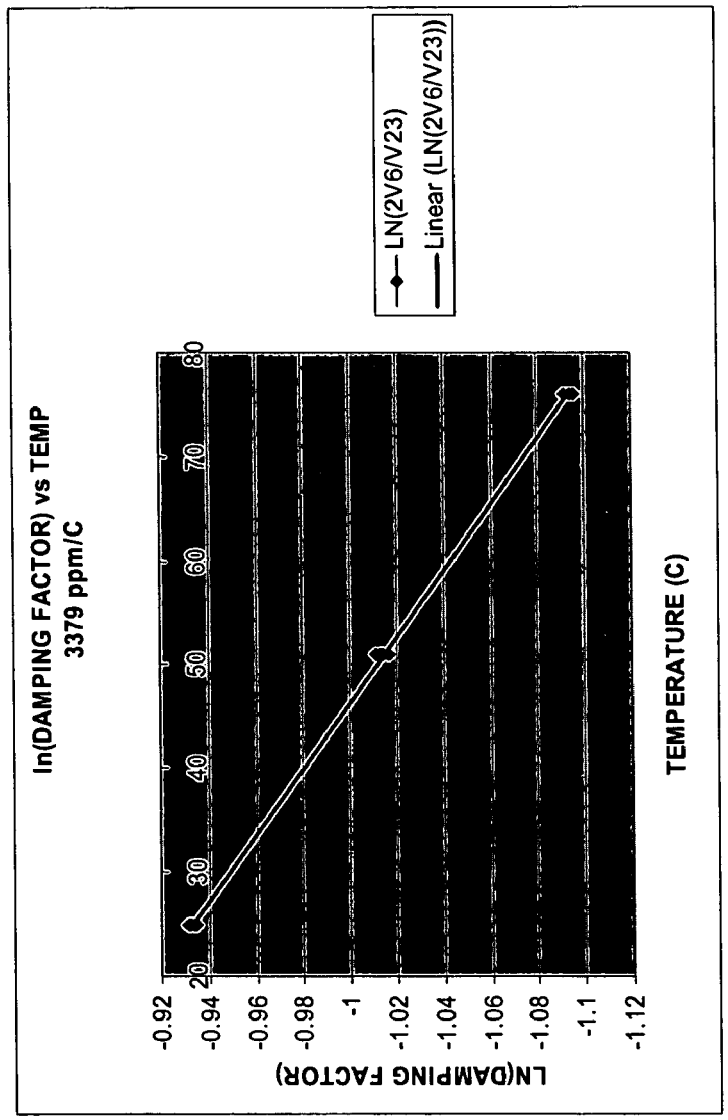
FIG. 13 is an illustration of a graph 1300 that describes a relationship between damping factor and temperature in order to depict the efficiency of the subject temperature measurement systems and/or methodologies.

FIG. 13 illustrates a graph 1300 that describes a relationship between damping factor and temperature in order to depict the efficiency of the subject temperature measurement systems and/or methodologies. As illustrated, the natural log of a damping factor for a resonant circuit in a proximity sensor has a linear relationship with a temperature at which a sensing coil operates. The damping factor is the reciprocal of a time constant $\tau_{L/R}$, which is proportional to the inductance of $L_1$ divided by twice the resistance of $R_2$, described supra. Thus, the damping factor is proportional to twice the resistance $R_2$ divided by the inductance $L_1$ in the resonant circuit.

Figure 14:
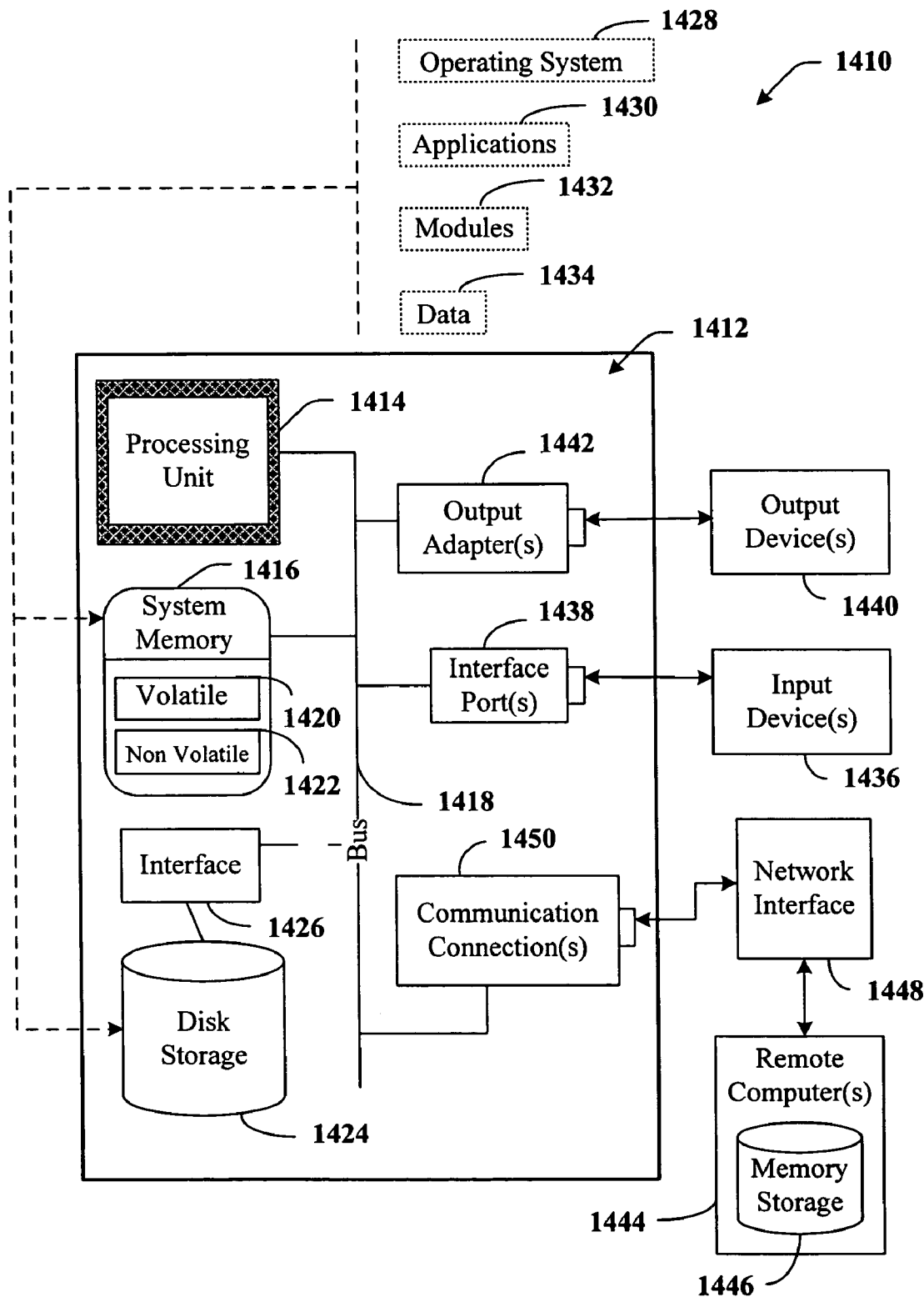
FIGS. 14 and 15 are illustrations of exemplary operating environments 1400 and 1500 that can be employed in connection with the subject invention.
Figure 15:
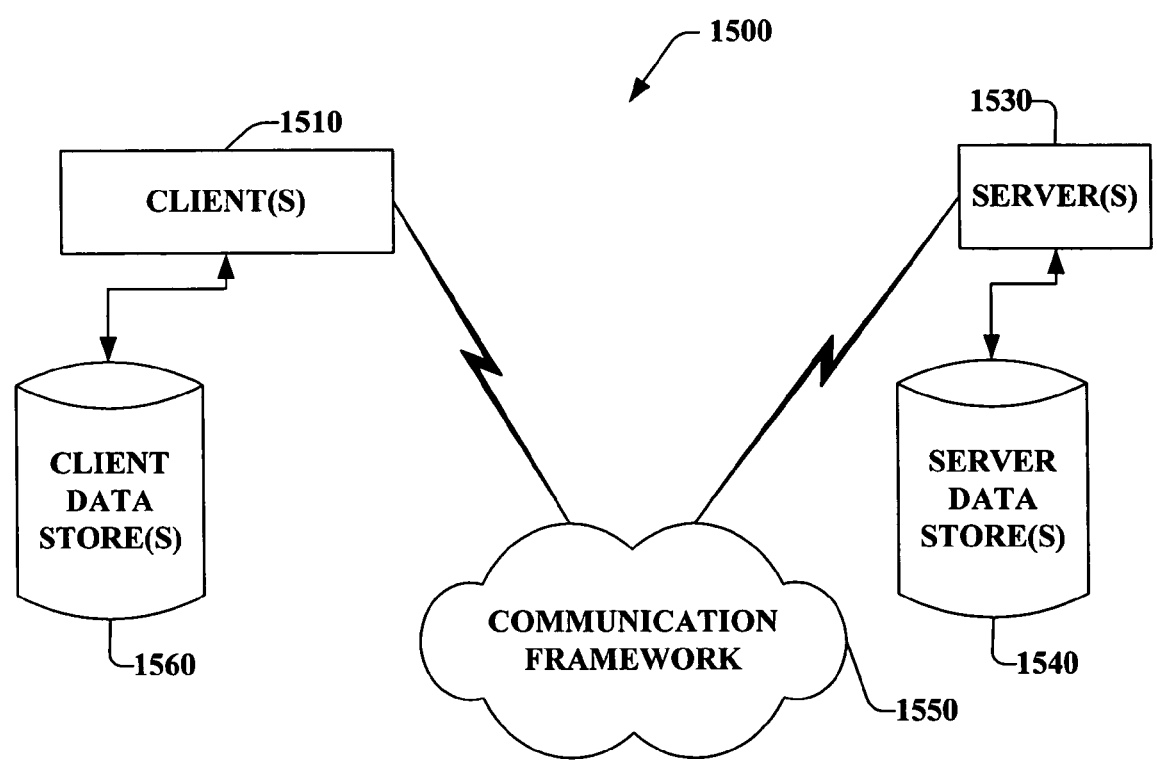

In order to provide a context for the various aspects of the invention, FIGS. 14 and 15 as well as the following discussion are intended to provide a brief, general description of a suitable computing environment in which the various aspects of the present invention can be implemented. While the invention has been described above in the general context of computer-executable instructions of a computer program that runs on a computer and/or computers, those skilled in the art will recognize that the invention also can be implemented in combination with other program modules. Generally, program modules include routines, programs, components, data structures, etc. that perform particular tasks and/or implement particular abstract data types. Moreover, those skilled in the art will appreciate that the inventive methods can be practiced with other computer system configurations, including single-processor or multiprocessor computer systems, mini-computing devices, mainframe computers, as well as personal computers, hand-held computing devices, microprocessor-based or programmable consumer electronics, and the like. The illustrated aspects of the invention can also be practiced in distributed computing environments where tasks are performed by remote processing devices that are linked through a communications network. However, some, if not all, aspects of the invention can be practiced on stand-alone computers. In a distributed computing environment, program modules can be located in both local and remote memory storage devices.

It will be appreciated that the invention can also be implemented by custom integrated circuits which perform the control and measurement function. For example, the measured voltages need not be digital values resulting from A/D conversions, but can be treated in the analog realm, as in a sample and hold circuit, accompanied by operational amplifiers and/or comparator circuits to perform the control and measurement functions, or any other suitable analog arrangement.

With reference to FIG. 14, an exemplary environment 1410 for implementing various aspects of the invention includes a computer 1412. The computer 1412 includes a processing unit 1414, a system memory 1416, and a system bus 1418. The system bus 1418 couples system components including, but not limited to, the system memory 1416 to the processing unit 1414. The processing unit 1414 can be any of various available processors. Dual microprocessors and other multiprocessor architectures also can be employed as the processing unit 1414.

The system bus 1418 can be any of several types of bus structure(s) including the memory bus or memory controller, a peripheral bus or external bus, and/or a local bus using any variety of available bus architectures including, but not limited to, 8-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

The system memory 1416 includes volatile memory 1420 and nonvolatile memory 1422. The basic input/output system (BIOS), containing the basic routines to transfer information between elements within the computer 1412, such as during start-up, is stored in nonvolatile memory 1422. By way of illustration, and not limitation, nonvolatile memory 1422 can include read only memory (ROM), programmable ROM (PROM), electrically programmable ROM (EPROM), electrically erasable ROM (EEPROM), or flash memory. Volatile memory 1420 includes random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Computer 1412 also includes removable/non-removable, volatile/non-volatile computer storage media. FIG. 14 illustrates, for example a disk storage 1424. Disk storage 1424 includes, but is not limited to, devices like a magnetic disk drive, floppy disk drive, tape drive, Jaz drive, Zip drive, LS-100 drive, flash memory card, or memory stick. In addition, disk storage 1424 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1424 to the system bus 1418, a removable or non-removable interface is typically used such as interface 1426.

It is to be appreciated that FIG. 14 describes software that acts as an intermediary between users and the basic computer resources described in suitable operating environment 1410. Such software includes an operating system 1428. Operating system 1428, which can be stored on disk storage 1424, acts to control and allocate resources of the computer system 1412. System applications 1430 take advantage of the management of resources by operating system 1428 through program modules 1432 and program data 1434 stored either in system memory 1416 or on disk storage 1424. It is to be appreciated that the subject invention can be implemented with various operating systems or combinations of operating systems.

A user enters commands or information into the computer 1412 through input device(s) 1436. Input devices 1436 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1414 through the system bus 1418 via interface port(s) 1438. Interface port(s) 1438 include, for example, a serial port, a parallel port, a game port, and a universal serial bus (USB). Output device(s) 1440 use some of the same type of ports as input device(s) 1436. Thus, for example, a USB port may be used to provide input to computer 1412, and to output information from computer 1412 to an output device 1440. Output adapter 1442 is provided to illustrate that there are some output devices 1440 like monitors, speakers, and printers, among other output devices 1440, which require special adapters. The output adapters 1442 include, by way of illustration and not limitation, video and sound cards that provide a means of connection between the output device 1440 and the system bus 1418. It should be noted that other devices and/or systems of devices provide both input and output capabilities such as remote computer(s) 1444.

Computer 1412 can operate in a networked environment using logical connections to one or more remote computers, such as remote computer(s) 1444. The remote computer(s) 1444 can be a personal computer, a server, a router, a network PC, a workstation, a microprocessor based appliance, a peer device or other common network node and the like, and typically includes many or all of the elements described relative to computer 1412. For purposes of brevity, only a memory storage device 1446 is illustrated with remote computer(s) 1444. Remote computer(s) 1444 is logically connected to computer 1412 through a network interface 1448 and then physically connected via communication connection 1450. Network interface 1448 encompasses communication networks such as local-area networks (LAN) and wide-area networks (WAN). LAN technologies include Fiber Distributed Data Interface (FDDI), Copper Distributed Data Interface (CDDI), Ethernet/IEEE 1102.3, Token Ring/IEEE 1102.5 and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1450 refers to the hardware/software employed to connect the network interface 1448 to the bus 1418. While communication connection 1450 is shown for illustrative clarity inside computer 1412, it can also be external to computer 1412. The hardware/software necessary for connection to the network interface 1448 includes, for exemplary purposes only, internal and external technologies such as, modems including regular telephone grade modems, cable modems and DSL modems, ISDN adapters, and Ethernet cards.

FIG. 15 is a schematic block diagram of a sample-computing environment 1500 with which the subject invention can interact. The system 1500 includes one or more client(s) 1510. The client(s) 1510 can be hardware and/or software (e.g., threads, processes, computing devices). The system 1500 also includes one or more server(s) 1530. The server(s) 1530 can also be hardware and/or software (e.g., threads, processes, computing devices). The servers 1530 can house threads to perform transformations by employing the subject invention, for example. One possible communication between a client 1510 and a server 1530 can be in the form of a data packet adapted to be transmitted between two or more computer processes. The system 1500 includes a communication framework 1550 that can be employed to facilitate communications between the client(s) 1510 and the server(s) 1530. The client(s) 1510 are operably connected to one or more client data store(s) 1560 that can be employed to store information local to the client(s) 1510. Similarly, the server(s) 1530 are operably connected to one or more server data store(s) 1540 that can be employed to store information local to the servers 1530.

What has been described above includes examples of the subject invention. It is, of course, not possible to describe every conceivable combination of components or methodologies for purposes of describing the subject invention, but one of ordinary skill in the art may recognize that many further combinations and permutations of the subject invention are possible. Accordingly, the subject invention is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system that measures a temperature of a sensing coil in an extended range inductive proximity sensor, comprising:
   a measuring component that measures voltages in a resonant damping circuit in the proximity sensor before and during a damped oscillatory voltage decay period; and
   a control component that receives information from the measuring component and analyzes measured voltages to derive a gamma value related to a damping factor for the resonant damping circuit to determine a temperature of the sensing coil.

2. They system of claim 1, the control component activates a first transistor device to provide a current pulse to charge a capacitor in the resonant damping circuit.

3. The system of claim 2, the current pulse is limited to the duration of approximately one time constant, the time constant is equal to the product of the capacitance of the capacitor and the resistance of a precision resistor connected to the resonant damping circuit.

4. The system of claim 2, the measuring component takes a first voltage measurement after deactivation of the first transistor device and cessation of the current pulse.

5. The system of claim 4, the control component activates a second transistor device to initiate an oscillatory decay of the voltage in the resonant damping circuit.

6. The system of claim 5, the measuring component takes a second voltage measurement after oscillatory decay of the voltage in the resonant damping circuit has occurred for a predetermined time period.

7. The system of claim 6, the gamma value is determined by dividing the second voltage measurement by the first voltage measurement.

8. The system of claim 1, the gamma value is defined by the expression:

$$\gamma = e^{-(R_2/2L_1)\Delta t}$$

where $R_2$ is a resistor in the resonant damping circuit that defines coil resistance, $L_1$ is an inductor in the resonant damping circuit, and $\Delta t$ is the time between voltage measurements.

9. The system of claim 1, the voltage measurements are peak voltage measurements on an oscillating voltage before and during a damping phase.

10. The system of claim 1, the resonant circuit is part of an oscillator circuit in a proximity sensor.

11. A method for determining coil temperature in a proximity sensor with minimal current consumption, comprising:
    determining a gamma value for the resonant circuit such that $$\gamma = e^{-(R_2/2L_1)\Delta t}$$

where $R_2$ is a resistor in the resonant circuit and $L_1$ is an inductor in the resonant circuit; and $\Delta t$ is the time difference between voltage measurements and
    determining a temperature of a sensor coil in the proximity sensor based at least in part on the gamma value.

12. The method of claim 11, the gamma value is determined by measuring a first voltage and a second voltage, and dividing the second voltage by the first voltage.

13. The method of claim 12, the first and second voltages have values such that $$V_1 = V_p e^{-(R_2/2L_1)t_1} \sin(\omega t_1); \text{ and}$$

$$V_2 = V_p e^{-(R_2/2L_1)t_2} \sin(\omega t_2);$$

where $t_1$ is the time of the first voltage measurement and $t_2$ is the time of the second voltage measurement and Vp is a voltage applied to a first transistor to provide current pulse.

14. The method of claim 13, the first and second voltages are measured at oscillatory peaks to reduce the sine arguments to a value of 1, such that $\omega t_2 = \omega t_1 + 2n\pi$, where n is an integer.

15. The method of claim 12, further comprising measuring a period of oscillation $T_s$ in the resonant circuit.

16. The method of claim 15, determining the inductance $L_1$ in the resonant circuit comprises solving for $L_1$ using the following expression:

$$L_1 = (T_s^2)/(4\pi^2 C_1),$$

where $T_s$ is a measured period of oscillation and $C_1$ is a capacitance in the resonant circuit.

17. The method of claim 16, further comprising employing the value $L_1$ to determine coil temperature such that $$L_1 = L_S + L_T,$$

where $L_S$ is a portion of inductance due to a target, and $L_T$ is a portion of inductance due to temperature, and where $L_T$ is compared to a predetermined expected value for $L_T$ and temperature is determined via known inductance characteristics with respect to temperature.

18. The method of claim 16, determining the change in coil temperature comprises solving for dT using the expression:

$$dT = \frac{2L_1}{\Delta t \cdot \frac{\partial R_2}{\partial T}} d(\ln \gamma),$$

where $R_2$ is a value of resistance in the coil.

19. The method of claim 18, further comprising adding the reference coil temperature $T_0$ to the change in coil temperature dT to determine total coil temperature.

20. The method of claim 11, determining the gamma value comprises:
    determining an RC time constant for a resonant circuit in the proximity sensor;
    pulsing a current for a first predetermined time period through the resonant circuit to charge a capacitor therein and to mitigate current consumption by the proximity sensor;
    determining a first voltage across the resonant circuit;
    causing the voltage across the resonant circuit to decay for a second predetermined time period; and
    determining a second voltage across the resonant circuit after the predetermined time period.

21. The method of claim 20, determining the RC time constant comprises multiplying a capacitance value $C_1$ for a capacitor in the resonant circuit by a resistance value $R_1$ for a precision resistor coupled to the resonant circuit.

22. The method of claim 20, the first predetermined time period is equal to approximately one RC time constant.

23. A method for determining temperature in a sensor coil in an oscillator circuit of an inductive proximity sensor, comprising:
    measuring a first tank voltage in the oscillator circuit;
    quenching the oscillator circuit to induce a period of oscillatory voltage decay;
    measuring a second tank voltage after a predetermined time period; and
    dividing the second tank voltage by the first tank voltage to determine a gamma value.

24. The method of claim 23, further comprising determining an inductance in the sensor coil from the gamma value.

25. The method of claim 24, further comprising determining coil temperature by comparing the determined inductance to a reference inductance value and performing a lookup of temperature variation with respect to inductance.

26. A system that facilitates a determination of temperature of a sensor coil in an extended range proximity sensor, comprising:
    means for determining a time constant value for a resonant damping circuit in the proximity sensor;
    means for determining a total circuit inductance $L_1$; and
    means for determining a temperature of the sensor coil based at least in part on the time constant value and the inductance of the resonant damping circuit.

27. The system of claim 26, the means for determining a time constant value comprises means for measuring first and second voltage values across the resonant damping circuit before and during a period of damped oscillatory voltage decay, respectively.

28. The system of claim 27, the means for determining a time constant value further comprises means for dividing the second voltage value by the first voltage value to derive the time constant value, $\gamma$, where:

$$\gamma = e^{-(R_2/2L_1)\Delta t}$$

and where $R_2$ is sensor coil resistance, $L_1$ is sensor coil inductance, and $\Delta t$ is the time difference between voltage measurements.

* * * * *